AMPLIFIER WITH HIGH INPUT IMPEDANCE

Filed Feb. 5, 1965

INVENTORS
NORMAN P. HUFFNAGLE
RUFUS L. COOK
BY
ATTYS.

3,383,611
Patented May 14, 1968

3,383,611

AMPLIFIER WITH HIGH INPUT IMPEDANCE

Norman P. Huffnagle, Box B-4, 607 W. 11th St., and Rufus L. Cook, 1208 Lisenby Ave., both of Panama City, Fla. 32401

Filed Feb. 5, 1965, Ser. No. 430,775
12 Claims. (Cl. 330—16)

ABSTRACT OF THE DISCLOSURE

A high impedance broad frequency range preamplifier, having a cascaded dual-transistor first amplifier stage for effecting frequency stabilizing degenerative feedback therein, for producing a circuit isolated amplified output signal thereat; a high frequency stabilized second amplifier stage, having emitter stability enhancement effected by local degenerative feedback circuitry incorporated therein, for further amplifying said ciruit isolated output signal; a high-pass, low-frequency, rejection filter for filtering said further amplified output signal in such manner as to enhance the high frequency response thereof; and a transistorized third stage, having sufficient base-to collector capacitance for effecting a negative feedback therein, for amplifying and improving the high frequency stability of said further amplified output signal.

Figures 1, 2:
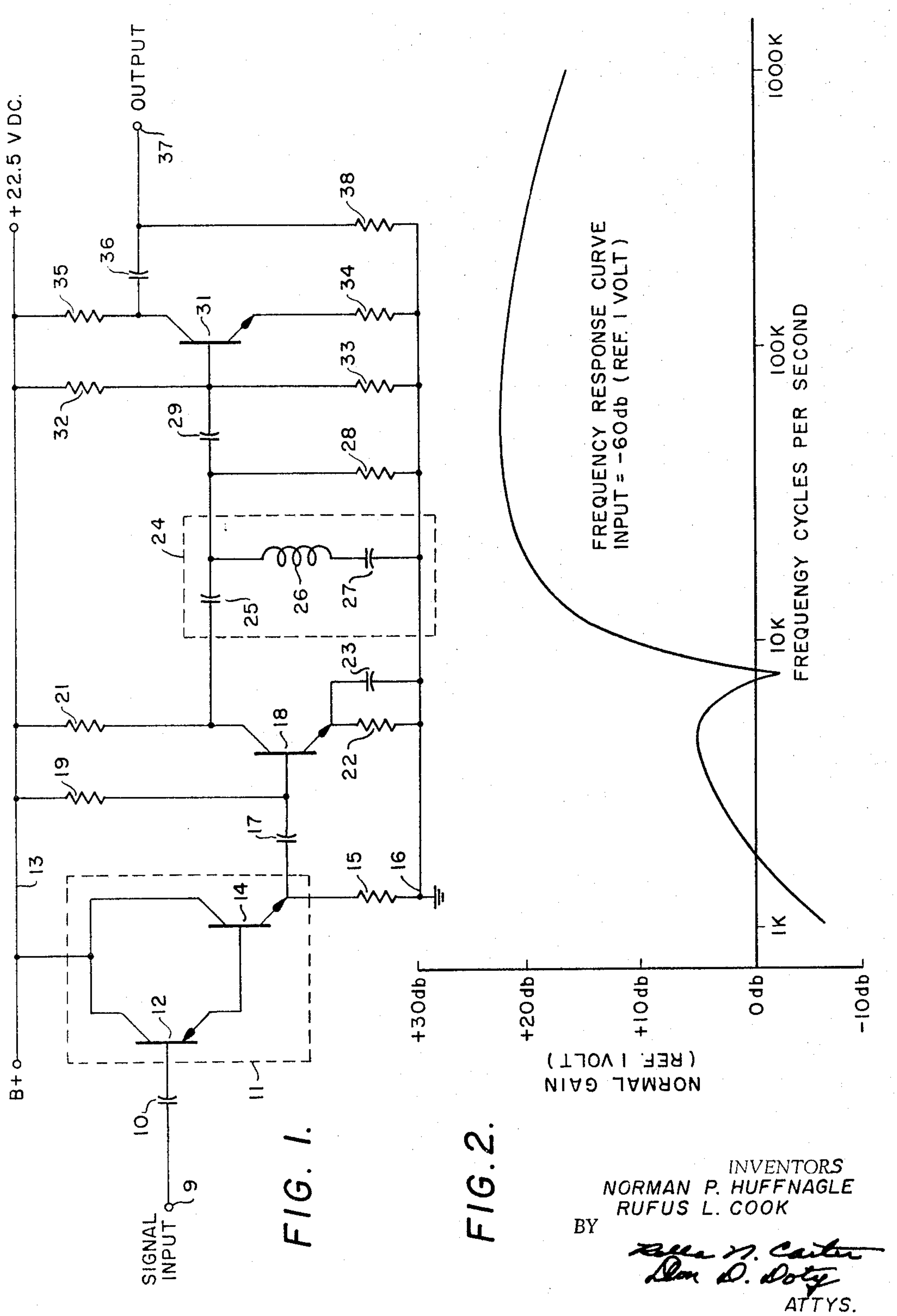

The invention described herein may be manufactured and used by or for the Government of the United States of America for governmental purposes without the payment of any royalties thereon or therefor.

The present invention relates generally to electronic amplifiers and in particular is a transistorized preamplifier having a very high input impedance, a relatively high nominal gain, a relatively high signal-to-noise ratio, and a broad frequency range.

In the past, it has been exceedingly difficult to produce a high input impedance preamplifier which provides optimum amplification of electrical signals produced by piezoelectric type of transducers and especially piezoelectric electroacoustical hydrophones such as those used in underwater sound operations. Although the amplifiers of comparable prior art are satisfactory for many practical purposes; as a matter of fact, they appear to leave a great deal to be desired when operating in conjunction with devices that are adversely affected by excessive loading dut to their low input impedance. Although several amplifiers currently in use for this purpose do have substantially the required input impedance, they unforturnately have relatively high noise levels of about −93 db (ref. 1 volt), they require high voltage power supplies, they need special shock mountings, and special transistor grading is usually required in order to effect whatever signal-to-noise characteristics that they have. In some instances, field effect transistors have been acceptable in preamplifiers from an operational characteristics standpoint, but their unit cost is considerable and, thus, may be prohibitive for many practical purposes. Hence, it has definitely been desirable to find a transistorized amplifier circuit that performs quite well but does not have the aforementioned undesirable qualities.

The present invention overcomes most of the disadvantages of the prior art in that it is a very effective preamplifier that neither adversely loads associated equipment nor requires special, complex, or expensive elements in the circuitry thereof.

It is, therefore, an object of this invention to provide an improved transistorized amplifier.

Another object of this invention is to provide a preamplifier having a high input impedance.

Still another object of this invention is to provide a preamplifier that will not excessively load associated electronic equipment which supplies the electrical input signal thereto.

Still another object of this invention is to provide a high gain preamplifier that will not excessively load an associated piezoelectric type of transducer.

A further object of this invention is to provide a broad band preamplifier having an operating frequency range of from approximately 10,000 cycles per second to one megacycle.

Another object of this invntion is to provide transistorized amplifier having improved signal-to-noise characteristics within its normal operating frequency range.

Another object of this invention is to provide a preamplifier having a nominal gain of 20 db (ref. 1 volt) throughout the operational frequency range for a given −60 db input signal.

Still another object of this invention is to provide a transistorized preamplifier that produces a family of substantially flat frequency response curves within the operational frequency range for a given plurality of input signals, respectively.

Another object of this invention is to provide an improved transistorized preamplifier that has a relatively small and simple circuit and may easily and economically be manufactured, maintained, and operated.

Another object of this invention is to provide a preamplifier that does not require the special grading or selection of the transistors incorporated therein.

Other objects and many of the attendant advantages of this invention will be readily appreciated as the same becomes better understood by reference to the following detailed description when considered in conjunction with the accompanying drawing wherein:

FIG. 1 is a detailed electronic schematic diagram of an amplifier incorporating the subject invention; and FIG. 2 is a graphical representation of one of a family of typical frequency response curves of the amplifier of FIG. 1 with nominal gain plotted against frequency.

Referring now to FIG. 1, the schematic diagram of the preamplifier constituting this invention is shown as having an input terminal 9 to which is applied the signal to be amplified. The input terminal 9 is coupled through a .01 mf. capacitor 10 to the input of a reverse-symmetry front end amplifier circuit 11 which, in this particular case, is the base of a 2N331 transistor 12. The collector of the transistor 12 is connected directly to a +22.5 direct current B+ voltage, and the emitter thereof is connected directly to the base of a 2N2102 transistor 14. The collector of the transistor 14 is likewise directly connected to the aforesaid B+ voltage, and the emitter thereof is coupled through a 50,000 ohm resistor 15 to a ground 16.

The output of the transistor 14 is taken from the emitter thereof and coupled through a .1 mf. capacitor 17 to the base of a 2N2102 transistor 18. The base of said transistor 18 is also coupled through a resistor 19 to the aforesaid B+ voltage, the collector thereof is likewise coupled through a resistor 21 to said B+ voltage, and the emitter thereof is coupled through a resistor 22 to ground. A bypass capacitor 23 is connected in parallel with said resistor 22.

The output from transistor 18 is taken from the collector thereof which is connected to a highpass, low frequency rejection filter 24 consisting of a .135 mf. capacitor 25, a 2.7 millihenry inductance 26 and a .158 mf. capacitor 27. As may readily be seen, said inductance 26 and capacitor 27 are connected in series and coupled between the output of the aforesaid capacitor 25 and ground. The output of the filter 24 is taken from the common junction of capacitor 25 and inductance 26 and is applied through an 82 ohm load resistor 28 to ground. The output of the filter 24 is also connected through a .135 mf. capacitor 29 to the base of a 2N2102 transistor 31. Said base of the transistor 31 is coupled through a 1 meg. resistor 32 to the aforesaid B+ voltage and through a 100,000 ohm biasing resistor 33 to ground. The emitter of the transistor 31 is coupled through a 1,000 ohm resistor 34 to ground and the collector thereof is coupled through a 10,000 ohm resistor 35 to said B+ voltage.

The output of the transistor 31 is taken from the collector thereof and is connected through a .1 mf. capacitor 36 to an output terminal 37. A 100 ohm load resistor 38 is connected between said output terminal 37 and said ground.

FIG. 2 represents a typical frequency response curve that may be obtained from using the preamplifier of FIG. 1. Although, as would be obvious to one skilled in the art, the curve of FIG. 2 is only one of a large family of curves which may likewise be obtained from this invention, it is herewith presented in order to illustrate that the subject invention produces a rather ideal flat frequency response between the normal operating frequencies of approximately 10,000 cycles per second to 1,000,000 cycles per second. Furthermore, this curve discloses that the frequency response drops off rather rapidly below the 10,000 cycle per second frequency, and at frequencies lower than 10,000 cycles per second, it never even approaches the gain of the aforementioned operational range of 10,000 cycles per second through 1,000,000 cycles per second.

Specifically, this is a frequency response curve where the input signal had a level of −60 decibel (db) with reference to 1 volt. Hence, the entire operational range approaches a gain of approximately +20 db, although, as may readily be seen, a portion of the curve indicating such range may be slightly above said +20 db and a portion thereof may likewise fall slightly below said +20 db, as the frequency increases toward the 1,000,000 cycles per second frequency. However, and this is of considerable importance, the low frequency portion of the curve, that is, frequencies lower than approximately 10,000 cycles per second, ordinarily never reaches a gain of more than +5 db, and as the frequency decreases, said gain is reduced to, say, something of the order of −5 db. Accordingly, it may readily be seen that frequencies below 9 or 10 thousand cycles per second produce a gain which is relatively small compared to the gain obtained within the normal operating range. Therefore, because spurious noise signals, if any, ordinarily occur within said lower band of frequencies, their gain, for most practical purposes, is negligible and the resulting signal-to-noise ratio obtained from this invention is a considerable improvement over most of those of the comparable prior art.

Briefly, the operation of the subject invention is as follows:

The signal to be amplified is applied to the input terminal 9 and in most instances said signal has substantially a sine waveform. Of course, signals having other waveforms will be amplified equally well by the invention; but, inasmuch as this particular preferred embodiment is primarily intended to be connected to the output of a piezoelectric hydrophone, it is particularly well suited for amplifying the substantially sinewave electrical signals emanating therefrom.

Because piezoelectric hydrophones have nominal impedances of approximately 40 megohms, any preamplifier used with them should have an input impedance comparable thereto, so as to prevent adverse loading of the transducer an appreciable amount. The reverse-symmetry transistor stage which constitutes the front-end amplifier stage of this invention makes such optimum impedance matching possible.

It has been found that small negative supply voltages are more susceptible to small voltage fluctuations superimposed on them than on comparable positive supply voltages. Also, it has been found that small current flows are more susceptible to minor modulating current influences, with the latter being one of the bases for transistor operation. Furthermore, transistors, being crystal devices, are susceptible to both flow and thermal noise. Flow noise, of course, is the random noise that is generated as a result of the flow of carriers (holes) thru the crystalline structure, and thermal noise is that noise which is generated by the random emission of electrons within the crystalline structure. For very low level input intelligence signals, the normal flow noise within a forward biased transistor may be of a sufficiently high level to be much larger than the intelligence signal and, hence, the intelligence signal may, for most practical purposes, be lost therein. Although the output level change is directly proportional to the input level change when the input level is large with respect to the flow and thermal noise levels, as the input signal level approaches the aforesaid noise levels the ratio thereof is no longer a linear function but, rather, is a complex function dependent on the inherent thermal stability and flow noise characteristics within the transistor involved. However, when a three terminal transistor is operated in reverse bias, the flow of carriers (holes) drops to a negligible value and, consequently, the random flow noise likewise drops to a relatively low level. In addition, the reverse biasing of transistors causes the thermal noise level to drop considerably, since, by principle of aggravation, said thermal noise is linked to the flow noise thereof. Due to the fact that in the reverse bias mode the main intelligence signal carriers in transistors are electrons or negative charges, and since, as previously mentioned, small negatives voltages are more susceptible to minor fluctuation than comparable positive ones, these negative carriers or charges are also susceptible to small input fluctuations and, accordingly, will accurately track them. Of course, any signal below the inherent noise levels will not be tracked, but, for reasons presented above, in the reversed biased transistor mode of operation, the noise levels are substantially below the normal noise that would ordinarily occur in circuits containing forward biased transistors. Hence, the overall inherent noise signals do not present nearly the problem in this invention as they do in comparable prior art devices, and the resulting signal-to-noise ratios are considerably improved thereover.

Connecting a transistor in the reversed bias mode also causes it to present a tremendously high impedance to any associated circuit supplying the input signal thereto. When transistors 12 and 14 are connected as shown in FIG. 1, small perturbations arriving at the reverse biased transistor 12 will act as a variable source for forward biased transistor 14 and the combined pair of transistors 12 and 14 function to provide a front-end amplifier stage which simultaneously contains high impedance input and emitter-follower circuit isolation output characteristics. For example, the total input impedance may be of the order of several megohms, and the input signal level to transistor 14 is always above the noise level thereof if the original input signal level is about the noise level of transistor 12.

In actual practice, the aforementioned input intelligence signal applied to terminal 9 is coupled through coupling capacitor 10 and amplified by front-end amplifier stage 11. In addition to providing high input impedance and circuit isolated output, the effective capacitance from the base of transistor 12 to the collector of transistor 14 acts to effect high frequency negative feedbock and, thus, provide improved frequency stabilization within the front-end amplifier stage. Resistor 15 acts as the load resistor for transistor 14 and the signal take off for the next stage. After passing through direct current blocking capacitor 17, the intelligence signal output of transistor 14 is coupled to the base of transistor 18 for further amplification thereby. Resistor 19 sets the bias for the transistor 18, and it also returns a small portion of said intelligence signal via resistor 21 for the high frequency stabilization thereof. As well as providing some local regenerative feedback, resistor 21 also provides for signal take-off from the transistor 18. Resistor 22 provides emitter stability for the transistor 18 as a result of the occurrence of neutralizing degenerative feedback. Capacitor 23, connected in parallel with the resistor 22, bypasses high frequency alternating current to ground.

Capacitor 25 acts as a direct current blocking capacitor from the transistor 18 and, in addition, when combined with the inductance 26 and the capacitor 27, it forms single M, highpass, low frequency rejection filter 24 which, in turn, operates to enhance the high frequency response of the entire preamplifier and, thus provide an optimum frequency response, such as is exemplarily depicted in FIG. 2.

To stabilize the entire circuit up to this point and prevent it from breaking into oscillation, the resistor 28 is included therein, and although it may have any appropriate resistance value between 25 and 100 ohms, it may not be over 100 ohms. Preferably, as previously mentioned, the resistor 28 should be 82 ohms.

As the intelligence signal is supplied by the filter 24, it is coupled through direct current blocking capacitor 29 to the base of the transistor 31. Resistors 32 and 33 provide the proper bias voltage for the transistor 31, and the resistor 32, along with the base-to-collector capacitance of the transistor 31, also provides negative feedback thereto which, likewise, improves the high frequency stability thereof.

Resistor 35 provides a collector load for the transistor 31 and provides a signal takeoff as well. Resistor 34 provides sufficient local degenerative feedback to stabilize the transistor 31, and it is not bypassed in order to effect the preferred low frequency degradation exemplarily depicted in FIG. 2.

The intelligence signal is supplied by the collector of the transistor 31 and is coupled through the direct current blocking capacitor 36 and across the loading resistor 38 to the output terminal 37 which, of course, acts as the output of the subject invention. As may readily be seen, the transistor 31 is not a true amplifier, as it has a gain of less than unity; however, it serves to isolate the transistor 18 from the output. Resistor 38 may have any resistance value between 25 and 100 ohms, since such resistance range prevents the transistor 31 from breaking into oscillation and, moreover, substantially eliminates sixty cycle line noise, if any, that may come from a DC power supply associated therewith.

Referring now to FIG. 2, the typical frequency response curve depicted therein illustrates the fact that below approximately 10,000 cycles per second the gain is quite small compared to the intended operational range of frequencies between 10,000 and 100,000 cycles per second. Hence, since the noise occurs for the most part in said lower frequency range, the signal-to-noise ratio of the operational frequency range is vastly improved.

Although the curve of FIG. 2 is that which is effected by an exemplary input signal of −60 db (ref. 1 volt), as previously mentioned, a similar family of curves is obtainable for other inputs, respectively. Therefore, the frequency responses obtainable from this invention are of considerable value from the application and use standpoints. Accordingly, because the output of this invention may be advantageously coupled to the input of any associated apparatus (such as other amplifiers, recorders, etc.) having an input impedance of at least 300 ohms, its possible uses are quite extensive.

Obviously other modifications of this embodiment or other embodiments of the subject invention will readily come to the mind of one skilled in the art having the benefit of the teachings presented herein in accompaniment with the associated drawing. Therefore, it is to be understood that the invention is not to be limited thereto and that said modifications and oher embodiments are intended to be included within the scope of the appended claims.

What is claimed is:

1. A preamplifier comprising in combination,
an input terminal,
a predetermined positive voltage,
a first transistor having a base, an emitter, and a collector with the base thereof connected to said input terminal and the collector thereof connected to said predetermined positive voltage,
a second transistor having a base, an emitter, and a collector with the base thereof connected to the emitter of said first transistor and the collector thereof connected to said predetermined positive voltage,
a ground,
a resistor interconnecting the emitter of said second transistor and said ground,
a first amplifier means connected to the emitter of said second transistor,
means interconnecting said first amplifier means and said ground for bypassing signal frequencies substantially within the frequency range of 1,000 to 10,000 cycles per second thereto,
filter means connected to the output of said first amplifier means for passing signal frequencies within substantially the frequency range of 10,000 to 1,000,000 cycles per second, and
second amplifier means connected to the output of said filter means for amplifying the signals emanating therefrom within said 10,000 to 1,000,000 cycles per second frequency range.

2. The device of claim 1 wherein said filter means comprises,
a first capacitor connected between the output of said first amplifier means and the input of said second amplifier means,
a second capacitor connected to said ground, and
an inductance connected between said interconnected first capacitor and second amplifier means input and said second capacitor.

3. An amplifier comprising in combination,
an input terminal,
a B+ voltage,
a first transistor having a base, an emitter, and a collector with the base thereof connected to said input terminal and the collector thereof coupled to said B+ voltage,
a ground,
a second transistor having a base, an emitter, and a collector with the base thereof connected to the emitter of said first transistor, and the collector thereof coupled to said B+ voltage,
a first resistor connected between the emitter of said second transistor and said ground, and
an output terminal connecter to the emitter of said second transistor.

4. The invention according to claim 3 further characterized by a capacitor connected between the base of said first transistor and the aforesaid input terminal.

5. An amplifier comprising in combination,
an input terminal,
a B+ voltage,
a first transistor having a base, an emitter, and a collector with the base thereof connected to said input terminal and the collector thereof coupled to said B+ voltage,
a ground,
a second transistor having a base, an emitter, and a collector with the base thereof connected to the emitter of said first transistor, and the collector thereof coupled to said B+ voltage,
a first resistor connected between the emitter of said second transistor and said ground,
a third transistor having a base, an emitter, and a collector, a first capacitor connected between the emitter of said second transistor and the base of said third transistor,
a second capacitor connected in parallel with the afore-third transistor and the aforesaid B+ voltage,
a third resistor interconnecting the collector of said third transistor and said B+ voltage,
a fourth resistor connected between the emitter of said third transistor and said ground,
a second capacitor connected in parallel with the aforesaid fourth resistor, and
an output terminal connected to the collector of said third transistor.

6. An amplifier comprising in combination,
an input terminal,
a B+ voltage,
a first transistor having a base, an emitter, and a collector with the base thereof connected to said input terminal and the collector thereof coupled to said B+ voltage,
a ground,
a second transistor having a base, an emitter, and a collector with the base thereof connected to the emitter of said first transistor, and the collector thereof coupled to said B+ voltage,
a first resistor connected between the emitter of said second transistor and said ground,
a third transistor having a base, an emitter, and a collector,
a first capacitor connected between the emitter of said second transistor and the base of said third transistor,
a second resistor connected between the base of said third transistor and the aforesaid B+ voltage,
a third resistor interconnecting the collector of said third transistor and said B+ voltage,
a fourth resistor connected between the emitter of said third transistor and said ground,
a second capacitor connected in parallel with the aforesaid fourth resistor,
a highpass filter connected to the collector of said third transistor, and
an output terminal connected to the output of said highpass filter.

7. The device of claim 6 wherein said high pass filter comprises,
a capacitor connected between the collector of said third transistor and the aforesaid output terminal,
an inductance having a pair of terminals, one of which is connected to the common junction of said capacitance and said output terminal, and
another capacitance connected between the other terminal of said inductance and the aforesaid ground.

8. The invention according to claim 7 further characterized by a resistor connected between the common junction of said inductance and output terminal and the aforesaid ground.

9. An amplifier comprising in combination,
an input terminal,
a B+ voltage,
a first transistor having a base, an emitter, and a collector with the base thereof connected to said input terminal and the collector thereof coupled to said B+ voltage,
a ground,
a second transistor having a base, an emitter, and a collector with the base thereof connected to the emitter of said first transistor, and the collector thereof coupled to said B+ voltage,
a first resistor connected between the emitter of said second transistor and said ground,
a third transistor having a base, an emitter, and a collector,
a first capacitor connected between the emitter of said second transistor and the base of said third transistor,
a second resistor connected between the base of said third transistor and the aforesaid B+ voltage, a third resistor connected between the collector of said third transistor and said B+ voltage,
a fourth resistor connected between the emitter of said third transistor and said ground,
a second capacitor connected in parallel with the aforesaid fourth resistor,
a series connected third capacitor, inductance, and fourth capacitor connected between the collector of said third transistor and said ground, and
a fifth resistor connected in parallel with said series connected inductance and fourth capacitor.

10. An amplifier comprising in combination,
an input terminal,
a B+ voltage,
a first transistor having a base, an emitter, and a collector with the base thereof connected to said input terminal and the collector thereof coupled to said B+ voltage,
a ground,
a second transistor having a base, an emitter, and a collector with the base thereof connected to the emitter of said first transistor, and the collector thereof coupled to said B+ voltage,
a first resistor connecter between the emitter of said second transistor and said ground,
a third transistor having a base, an emitter, and a collector,
a first capacitor connected between the emitter of said second transistor and the base of said third transistor,
a second resistor connected between the base of said third transistor and the aforesaid B+ voltage,
a third resistor connected between the collector of said third transistor and said B+ voltage,
a fourth resistor connected between the emitter of said third transistor and said ground,
a second capacitor connected in parallel with the aforesaid fourth resistor,
a series connected third capacitor, inductance, and fourth capacitor connected between the collector of said third transistor and said ground,
a fifth resistor connected in parallel with said series connected inductance and fourth capacitor,
a fourth transistor having a base, an emitter and, a collector,
a fifth capacitor interconnecting the common junction of said series connected third capacitor and inductance and the base of said fourth transistor,
a sixth resistor connected between the base of said fourth transistor and said B+ voltage,
a seventh resistor coupled between the base of said fourth transistor and said ground,
an eighth resistor connected between the collector of said fourth transistor and said B+ voltage,
a ninth resistor connected between the emitter of said fourth transistor and said ground, and
an output terminal connected to the collector of said fourth transistor.

11. The invention according to claim 10 further characterized by
a sixth capacitor connected between the collector of said foutrh transistor and said output terminal, and
a tenth resistor connected between said output terminal and the aforesaid ground.

12. An amplifier adapted for amplifying the electrical output signals of a piezoelectric electroacoustical transducer consisting of,
an input terminal,
a B+ voltage,
a first transistor having a base, an emitter, and a collector with the base thereof connected to said input terminal and the collector thereof coupled to said B+ voltage,
a ground,
a second transistor having a base, an emitter, and a collector with the base thereof connected to the emitter of said first transistor, and the collector thereof coupled to said B+ voltage, a first resistor connected between the emitter of said second transistor and said ground, a third transistor having a base, an emitter, and a collector, a first capacitor connected between the emitter of said second transistor and the base of said third transistor, a second resistor connected between the base of said third transistor and the aforesaid B+ voltage, a third resistor connected between the collector of said third transistor and said B+ voltage, a fourth resistor connected between the emitter of said third transistor and said ground, a second capacitor connected in parallel with the aforesaid fourth resistor, a series connected third capacitor, inductance, and fourth capacitor connected between the collector of said third transistor and said ground, a fifth resistor connected in parallel with said series connected inductance and fourth capacitor, a fourth transistor having a base, an emitter, and a collector, a fifth capacitor interconnecting the common junction of said series connected third capacitor and inductance and the base of said fourth transistor, a sixth resistor connected between the base of said fourth transistor and said B+ voltage, a seventh resistor coupled between the base of said fourth transistor and said ground, an eighth resistor connected between the collector of said fourth transistor and said B+ voltage, a ninth resistor connected between the emitter of said fourth transistor and said ground, an output terminal, a sixth capacitor connected between the collector of said fourth transistor and said output terminal, and a tenth resistor connected between said output terminal and the aforesaid ground.

References Cited

UNITED STATES PATENTS

| | | | |
|---|---|---|---|
| 3,093,740 | 6/1963 | Bush | 330—20 |
| 3,201,698 | 8/1965 | Irelan | 333—76 XR |

JOHN KOMINSKI, *Primary Examiner.*

ROY LAKE, *Examiner.*

E. C. FOLSOM, *Assistant Examiner.*